United States Patent [19]

Fathimulla et al.

[11] Patent Number: 4,769,343

[45] Date of Patent: Sep. 6, 1988

[54] SINGLE STEP LIFT-OFF TECHNIQUE FOR SUBMICRON GATES

[75] Inventors: Mohammed A. Fathimulla; Thomas C. Loughran; David R. Urech, all of Columbia, Md.

[73] Assignee: Allied-Signal Inc., Morristown, N.J.

[21] Appl. No.: 74,835

[22] Filed: Jul. 17, 1987

[51] Int. Cl.⁴ .......................................... H01C 21/441
[52] U.S. Cl. .................................. 437/187; 437/229; 437/944
[58] Field of Search ........................ 437/229, 944, 187

[56] References Cited

U.S. PATENT DOCUMENTS

| 4,489,101 | 12/1984 | Shibata | 437/229 X |
| 4,523,976 | 6/1985 | Bukhman | 437/229 X |
| 4,546,534 | 10/1985 | Nicholas | 437/229 X |
| 4,659,650 | 4/1987 | Moritz et al. | 437/229 X |
| 4,661,204 | 4/1987 | Mathur et al. | 437/229 X |

OTHER PUBLICATIONS

"Single Step Optical Lift-Off Process", IBM J. Res. Develop., vol. 24, No. 4, pp. 452-460, M. Hatzakis et al.-7/80.
"Single-Step Lift-Off Process Using Chlorobenzene Soak on AZ4000 Resists", J. Vac. Sci. Tech., B3(1), pp. 25-27, 1/85, A. Fathimulla, J.F/85.
"High Temp. Flow Resistance of Micron Sized Images in AZ Resists", IBM Research Lab., pp. 2645-2647, 12/81, Hiraoka et al., J. Electrochem. Soc.
"Deep UV Hardening of Positive Photoresist Patterns", Xerox Palo Alto Research Ctr., pp. 1379-1381, 6/82-R. Allen et al., vol. 129, No. 6.

Primary Examiner—George T. Ozaki
Attorney, Agent, or Firm—Robert M. Trepp; Bruce L. Lamb

[57] ABSTRACT

A method for forming a submicron width metal line on a substrate is described incorporating the steps of coating a substrate with a layer of photoresist, baking the layer, exposing the layer to a pattern, soaking the layer in a solution including chlorobenzene, developing the layer to form openings, baking the photoresist to remove any residual chlorobenzene, exposing the layer to deep ultraviolet radiation, baking the layer to cause the layer to flow at the edges of the openings, depositing metal on the layer and on the substrate, and dissolving the layer to lift off the metal disposited on the layer whereby the metal deposited on the substrate remains. The invention overcomes the problem of forming submicron width metal lines from one micron openings in a photoresist layer.

3 Claims, 4 Drawing Sheets

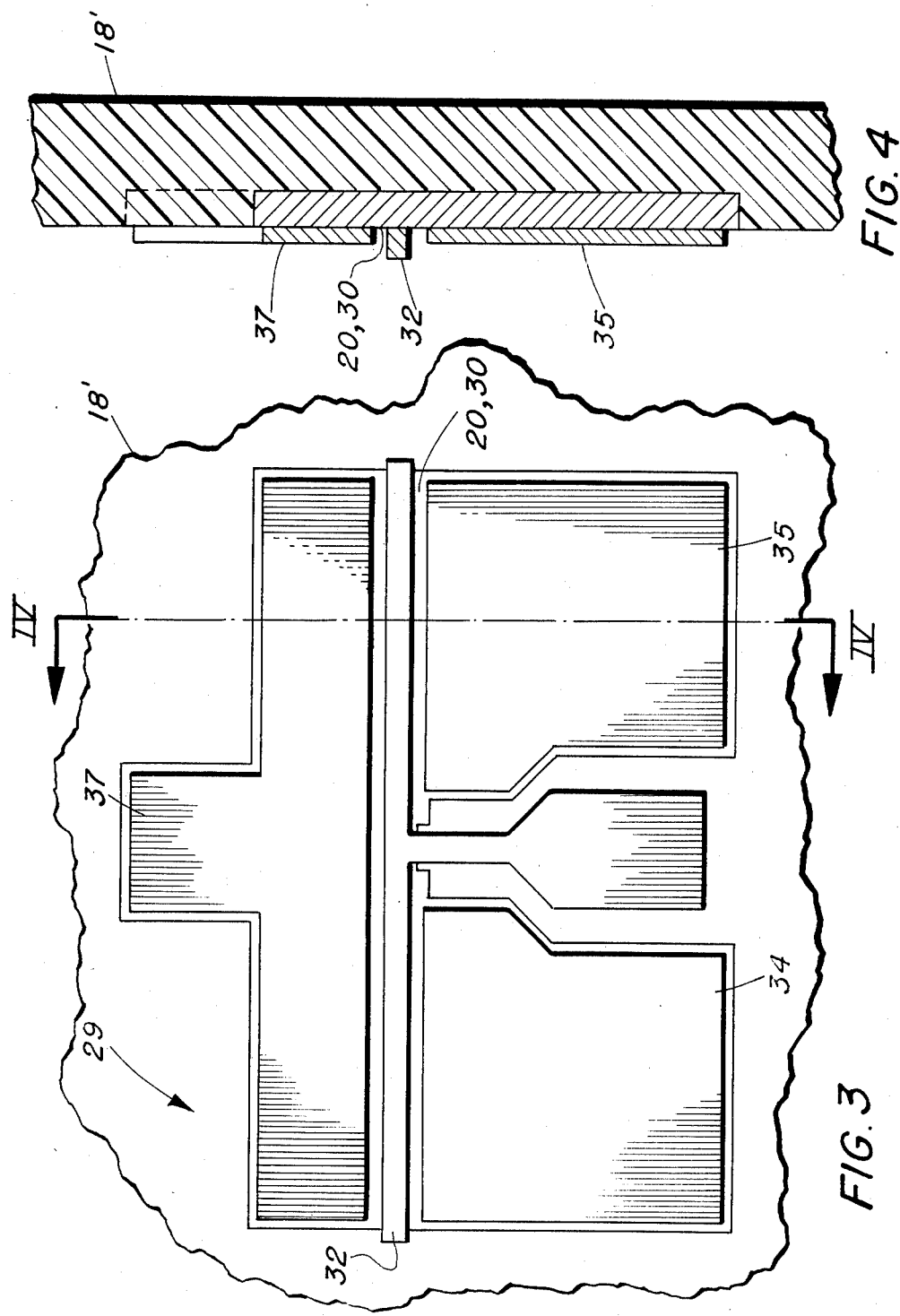

SINGLE STEP LIFT-OFF TECHNIQUE FOR SUBMICRON GATES

BACKGROUND OF THE INVENTION

1. Field of the Invention

This invention relates to metal semiconductor field effect transistors (MESFETs) and more particularly to fabricating MESFETs with submicron gates.

2. Description of the Prior Art

There has been a considerable effort to extend the frequency of operation of submicron GaAs MESFET devices to mm wave regions. Submicron MESFET devices have been fabricated by electron beam lithography, angle evaporation, by under etching the gate metal with another metal acting as the mask, and by metal lift-off techniques using optical lithography.

In a publication by M. Hatzakis et al., entitled "Single-Step Optical Lift-Off Process," IBM J. Res. Develop., Vol. 24, No. 4, Pp. 452–460, July 1980, a process is described that allows the use of the lift-off metalization technique with ultraviolet exposure of a single layer of photo resist. The process consists of soaking the resist layer for a predetermined time either in chlorobenzene or other aromatic solvents such as toluene and benzene before or after exposure. After development, resist profiles with overhangs suitable for lift-off metalization were obtained.

In a publication by A. Fathimulla, one of the inventors herein, entitled "Single-Step Lift-Off Process Using Chlorobenzene Soak on AZ4000 Resists", J. Vac. Sci. Technol. B3(1), Pp. 25–27, Jan./Feb. 1985. A single-step lift-off process using chlorobenzene soak on AZ4000 resists was described. The process provided thick overhang with vertical sidewalls, which are essential for the successful lift-off. UV hardening of the photo resist, AZ4110, increased the thermal stability of the overhang at temperatures obtained during deposition of metals such as tungsten. FIG. 3(a) of the publication shows a typical cross section of the photo resist having an overhang at the upper edge surface of the resist.

In a publication by H. Hiraoka et al. entitled "High Temperature Flow Resistance of Micron Sized Images in AZ Resists," J. Electrochem. Soc., Vol. 128, No. 12, Pp. 2645–2647, December 1981, a simple UV curing process is described that renders micron sized images in AZ resists resistant to flow when heated to temperatures as high as 210° C. The ultraviolet exposure, however, will only be effective when done without a post bake. It is a common practice to post bake resists in order to enhance the quality of the film.

In a publication by R. Allen, entitled "Deep U.V. Hardening of Positive Photoresist Patterns", J. Electrochem. Soc., Vol. 129, No. 6, Pp. 1379–1381, June 1982, the thermal deformation of positive photoresist patterns is significantly reduced during high temperature treatment by flood exposure of the photoresist with a low pressure mercury lamp containing deep UV at $\lambda=254$ nm. The stability of the photoresist patterns during high temperature after deep UV exposure was found to be due to the formation of an outer skin of higher polymerization.

SUMMARY OF THE INVENTION

A method is described for forming a submicron width metal line on a substrate comprising the steps of coating a substrate with a layer of positive photoresist, baking the photoresist layer to remove solvents, placing a mask containing a pattern over the photoresist layer or projecting an image onto the photoresist layer, exposing portions of the photoresist layer through the mask, soaking the photoresist layer in a solution including chlorobenzene for a predetermined time at a predetermined temperature, developing the photoresist to remove the portions exposed to form openings, exposing the developed photoresist layer to deep ultraviolet radiation for a predetermined time at a predetermined temperature, baking the developed photoresist layer for a predetermined time at a predetermined temperature to flow said photoresist layer at the edges of the openings, depositing metal on the developed photoresist layer and through the openings of the photoresist layer onto the substrate, and dissolving the developed photoresist layer to lift-off the metal deposited on the developed photoresist layer whereby the metal deposited onto the substrate remains.

It is an object of this invention to provide a technique for fabricating submicron gates with a single step lift-off process using conventional optical lithography.

It is a further object of this invention to flow the edges of the resist, depending on the particular resist, inward or outward.

It is a further object of this invention to provide a process which is simple and reduces the need for precise process control to provide submicron metal line widths.

It is a further object of this invention to bake a photoresist to cause the edges to flow subsequent to exposing the photoresist to deep UV radiation.

BRIEF DESCRIPTION OF THE DRAWING

FIG. 3 is a top view of a submicron metal semiconductor field effect transistor.

FIG. 4 is a cross-section view along the lines IV—IV of FIG. 3.

DESCRIPTION OF THE PREFERRED EMBODIMENT

A method for forming a submicron width metal line on a substrate will now be described. First, the substrate which may be, for example, a gallium arsenide substrate is coated with a layer of positive photoresist. The photoresist may be, for example, AZ1470, manufactured by the American Hoechst Corporation, Somerville, N.J., 08876. The class of lithographic materials labeled A2 resists consists of a mixture of a diazo-oxide (I) and a phenolic resin (IV). The photoresist may be applied to the substrate or wafer by spin coating which is well known in the art. Subsequent to coating, the substrate and photoresist layer is baked at a temperature in the range from 70° to 120° C. to remove solvents, which is well known in the art. Next, a mask containing a pattern is placed over the photoresist layer. The mask may have openings therein of 1 μm.

A radiant energy source exposes through the mask portions of the photoresist layer to cause a photochemical reaction in the exposed photoresist layer.

Next, the substrate and photoresist layer is soaked in a solution which includes chlorobenzene for a predetermined time at a predetermined temperature to modify the dissolution characteristics of the upper surface of the photoresist layer. Bake to remove chlorobenzene and to make a homogeneous layer.

The photoresist layer is developed to remove those portions exposed to the radiant energy source resulting in openings in photoresist layer.

Figure 1:
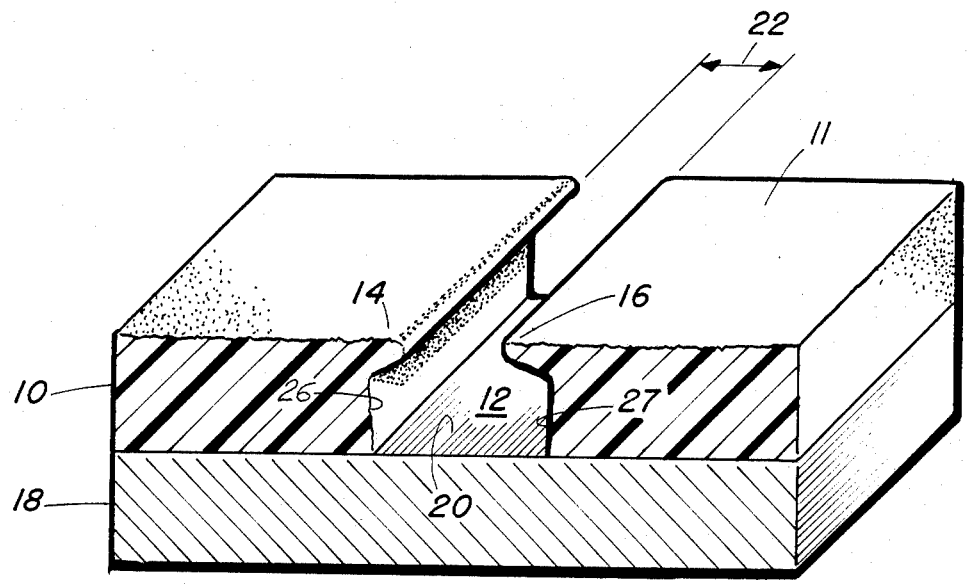
FIG. 1 is a perspective view of an opening in positive photoresist.

Referring to FIG. 1, an opening 12 in photoresist 10 is shown. Overhangs 14 and 16 extend over opening 12 due to the step of soaking the photoresist layer 10 in a solution including chlorobenzene. Substrate 18 having an upper surface 20 supports photoresist layer 10. The distance between overhangs 14 and 16 is one μm shown by arrow 22 in FIG. 1.

Next, photoresist layer 10 having an upper surface 11 shown in FIG. 1 is exposed to deep ultraviolet radiation for a predetermined time in the range of from 45 minutes to one hour, depending on the intensity of the radiation at room temperature. Deep ultraviolet radiation may be, for example, electromagnetic radiation having a wavelength in the range from 190 to 220 nanometers (nm).

Figure 2:
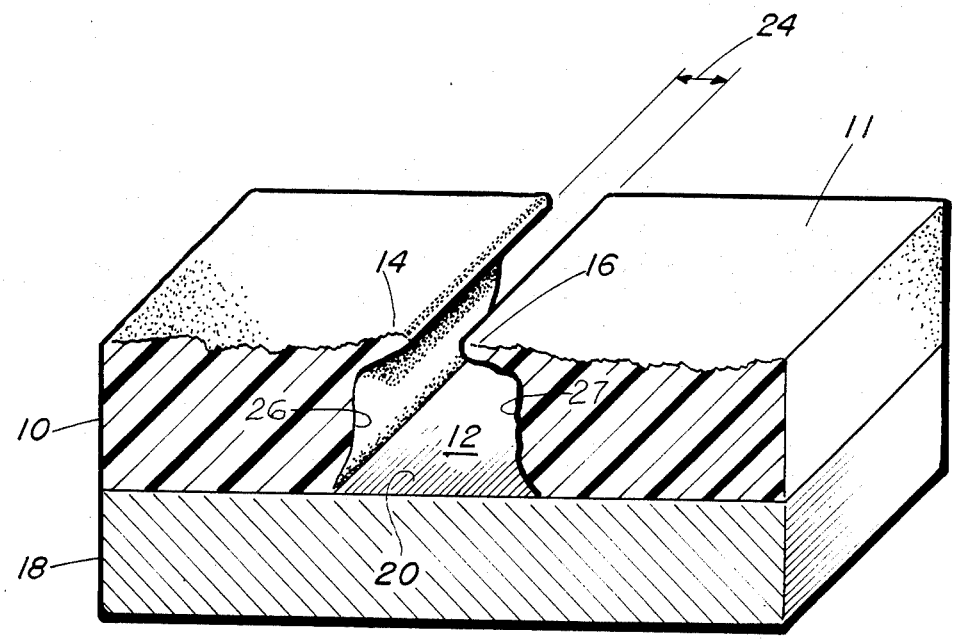
FIG. 2 is a perspective view of an opening in positive photoresist after baking.

Next, or concurrently with ultraviolet exposure, photoresist layer 10 is baked for a predetermined time in the range from one minute to fifteen minutes, depending upon the intensity, at a predetermined temperature in the range from 150° to 200° C. to flow photoresist layer 10 at the edges of openings, for example, overhangs 14 and 16 of opening 12. FIG. 2 is a perspective view of opening 20 in photoresist layer 10 after the step of baking. In FIG. 2, edges 26 and 27 of opening 12 of photoresist layer 10 flow inward. Overhangs 14 and 16 are positioned closer together as shown by arrow 24. Overhangs 14 and 16 may be spaced apart by 0.4 μm after the step of baking from an original spacing as shown by arrow 22 in FIG. 1 of 1 μm. If started with 0.5 μm, overhangs 14 and 16 might be closed to 0.2 μm.

Next, metal may be deposited on photoresist layer 10 and through opening 12 onto upper surface 20 of substrate 18. The metal may be aluminum or may be a combination of metals, such as titanium, platinum and gold or aluminum, platinum and gold. The gold provides a low ohmic conductor.

Next, photoresist layer 10 is dissolved to lift off the metal on photoresist layer 10. The metal deposited on the upper surface 20 of substrate 18 remains undisturbed or intact. The metal line formed below opening 12 will have a width of approximately 0.4 μm corresponding to the width of opening 12 shown by arrow 24 in FIG. 2. The submicron line width made in accordance with the method described above may be used to fabricate a metal semiconductor field effect transistor shown in FIGS. 3 and 4. In FIG. 3 a top view of a metal semiconductor field effect transitor (MESFET) 29 is shown. The invention is also applicable to the High Electron Mobility Transistor (HEMT) and to the Modulation Doped FET (MODFET). In FIG. 4 a cross section view along the lines IV—IV of FIG. 3 is shown. Substrate 18' may be semi-insulating and have an n active region formed therein by ion implantation of silicon ions or substrate 18' may have an n type epitaxial layer of gallium arsenide grown by MBE, MOCVD, VPE. The outline of n region 30 is shown in FIG. 3. For the implanted case, a capping layer was deposited over upper surface 20 of substrate 18'. n region 30 was annealed by raising the temperature of substrate 18' to a predetermined temperature. n region 30 may be isolated from other n regions 30 by utilizing a mesa process, for example, etching the gallium arsenide material away which is between n regions 30 or with boron, proton (hydrogen) implanted to form isolation between devices.

Next, gate region 32 is formed using the process described above to form submicron line widths. Finally, gold germanium-nickel ohmic contacts were deposited and alloyed to form the source regions 34 and 35 and drain region 37.

Figure 5:
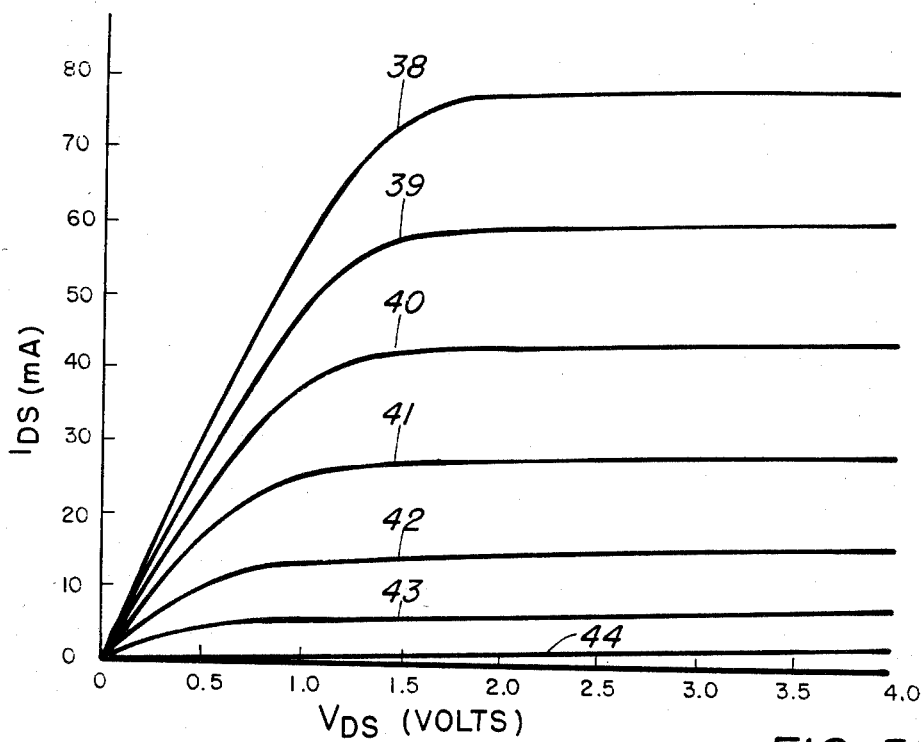
FIG. 5 is a graph of the current $I_{DS}$ vs. voltage $V_{DS}$ of the embodiment in FIG. 3.
Figure 6:
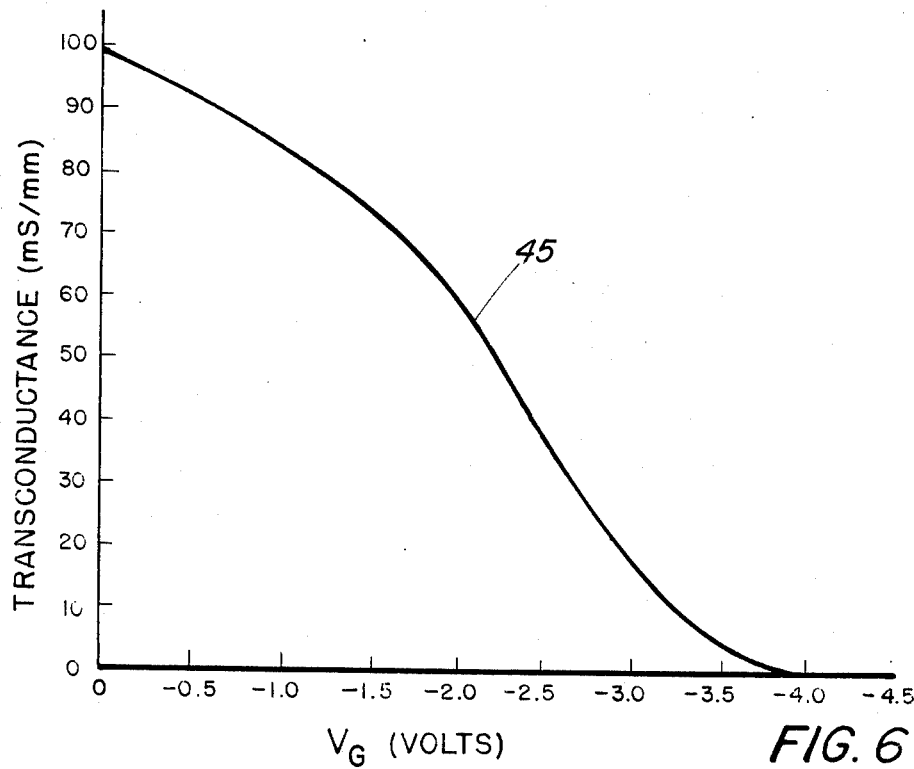
FIG. 6 is a graph of the transconductance (mS/mm) vs. $V_G$ of the embodiment in FIG. 3.

FIG. 5 is a graph of the current $I_{DS}$ vs. voltage $V_{DS}$ of the embodiment shown in FIG. 3. In FIG. 5 the ordinate represents $I_{DS}$ and the abcissa represents $V_{DS}$. Curves 38-44 show the typical IV characteristics of a 0.4 micron gate MESFET. A transconductance of 100 ms/mm was obtained for the device shown in FIG. 3 having 4.0 μm source to drain spacings. FIG. 6 is a graph of the transconductance vs. $V_G$ of the embodiment shown in FIG. 3. In FIG. 6, the ordinate represents transconductance and the abcissa represents $V_G$. Curve 45 shows the transconductance for various voltages $V_G$.

Figure 7:
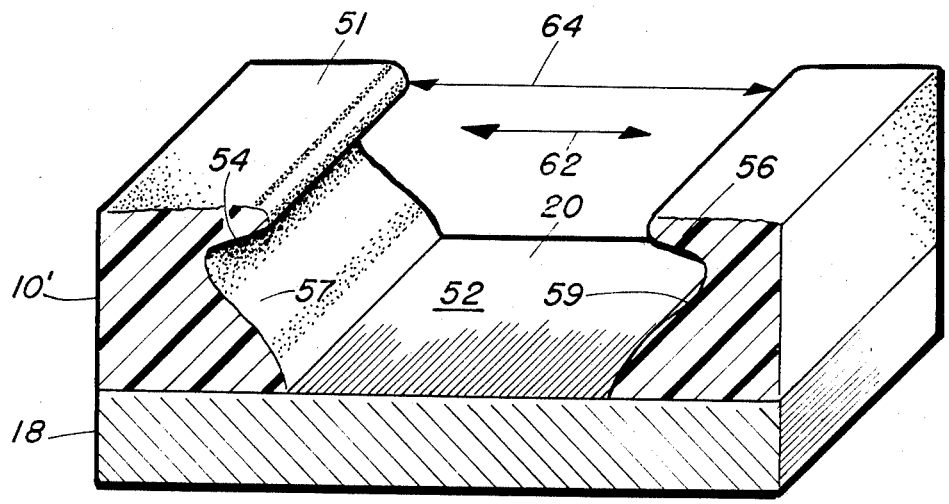
FIG. 7 is a perspective view of an opening in positive photoresist.

By substituting a different photoresist, for example, AZ4110 manufactured by the Shipley Co. of Newton, Mass. 02162, the openings in the photoresist layer 10' may be increased instead of decreased. FIG. 7 is a perspective view of an opening in positive photoresist wherein the positive photoresist is AZ4110. Photoresist layer 10' has an upper surface 51 and an opening 52. Overhangs 54 and 56 extend from the edges 57 and 59 to upper surface 51. Photoresist layer 10' is supported by substrate 18 having an upper surface 20. Prior to the step of baking at a temperature in the range between 150° C. to 200° C., overhangs 54 and 56 were spaced apart as shown by arrow 62. Subsequent to baking at a temperature in the range from 150° C. to 200° C. for a predetermined time, overhangs 54 and 56 are spaced apart further as shown by arrow 64. The flow of edges 57 and 59 in response to the step of baking is to widen opening 52.

Figure 8:
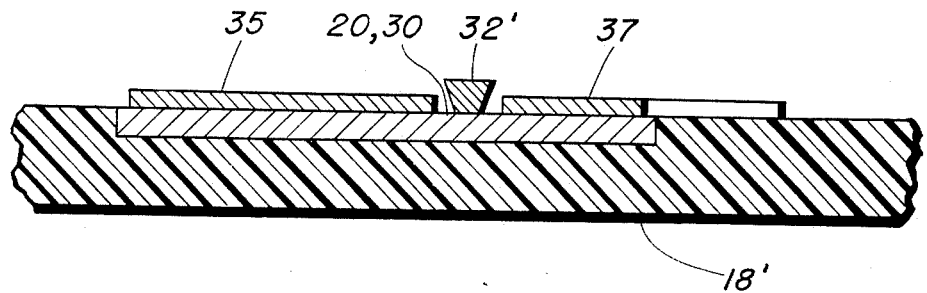
FIG. 8 is an alternate cross-section view along the lines IV—IV of FIG. 3.

FIG. 8 is an alternate cross section view along the lines IV—IV of FIG. 3 showing gate 32' of MESFET 29 formed by the process described above when photoresist type AZ4110 is used as photoresist layer 10'. As shown in FIG. 8, gate 32' has a mushroom or V cross section which may be incorporatd in a self-aligned process for making MESFETs.

A method for forming a submicron width metal line on a substrate has been described comprising the steps of coating the substrate with a layer of positive photoresist, baking the photoresist layer, placing a mask containing a pattern over the photoresist layer or projecting an image onto the photoresist layer, exposing portions of the photoresist layer through the mask with radiant energy, soaking the photoresist layer in a solution including chlorobenzene for a predetermined time and at a predetermined temperature, baking the photoresist layer to remove traces of chlorobenzene, developing the photoresist to remove the portions exposed to form openings in the photoresist, exposing the developed photoresist layer to deep ultraviolet radiation for a predetermined time and at a predetermined temperature, baking the developed photoresist layer for a predetermined time at a predetermined temperature to flow the photoresist layer at edges of the openings, depositing metal on the developed photoresist layer and through the openings of the photoresist layer onto the substrate, and dissolving the developed photoresist layer to lift off the metal deposited on the developed photoresist layer whereby the metal deposited onto the substrate remains.

The invention claimed is:

1. A method for forming a submicron width metal line on a substrate comprising the steps of:

coating said substrate with a layer of positive photoresist, baking said photoresist layer to remove solvents, placing a mask containing a pattern over said photoresist layer, exposing portions of said photoresist layer through said mask, soaking said photoresist layer in a solution including chlorobenzene for a predetermined time at a predetermined temperature, developing said photoresist to remove said portions exposed to form openings, baking said photoresist to remove residual chlorobenzene, exposing said developed photoresist layer to deep ultraviolet radiation for a predetermined time at a predetermined temperature, baking said developed photoresist layer for a predetermined time at a predetermined temperature to flow said photoresist layer at the edges of said openings, depositing metal on said developed photoresist layer and through said openings of said photoresist layer onto said substrate, and dissolving said developed photoresist layer to lift off said metal deposited on said developed photoresist layer whereby said metal deposited onto said substrate remains.

2. The method of claim 1 wherein said photoresist is selected to flow toward the openings at its edges during said step of baking.

3. The method of claim 1 wherein said photoresist is selected to flow away from the openings at its edges during said step of baking to cause the distance between the edges of the layer at openings to increase.

* * * * *